United States Patent [19]

Belt et al.

[11] Patent Number: 4,478,676
[45] Date of Patent: Oct. 23, 1984

[54] METHOD FOR DECREASING RADIAL TEMPERATURE GRADIENTS OF CRYSTAL GROWTH MELTS UTILIZING RADIANT ENERGY ABSORPTIVE MATERIALS AND CRYSTAL GROWTH CHAMBERS COMPRISING SUCH MATERIALS

[75] Inventors: Roger F. Belt, Morristown; Robert Uhrin, Landing, both of N.J.

[73] Assignee: Litton Systems, Inc., Morris Plains, N.J.

[21] Appl. No.: 415,764

[22] Filed: Sep. 7, 1982

[51] Int. Cl.³ .............................................. C30B 15/02
[52] U.S. Cl. ........................ 156/616 R; 156/617 SP; 156/DIG. 73; 156/DIG. 83; 422/248; 422/249; 432/10; 432/264; 373/155
[58] Field of Search ......... 156/617 SP, 617 H, 617 V, 156/DIG. 63, DIG. 83, DIG. 95, 616 R, 616 A, DIG. 73; 422/248, 249; 432/10, 254.1, 254.2, 264, 265; 373/139, 155; 423/363

[56] References Cited

U.S. PATENT DOCUMENTS

| | | | |
|---|---|---|---|
| 2,956,863 | 10/1960 | Goorissen | 422/249 |
| 3,180,632 | 4/1965 | Katz et al. | 432/264 |
| 3,328,311 | 6/1967 | Borchardt | 156/DIG. 63 |
| 3,687,437 | 8/1972 | Fischer | 373/155 |
| 4,032,390 | 6/1977 | Rice | 156/617 SP |
| 4,116,642 | 9/1978 | Chu et al. | 156/617 SP |
| 4,224,100 | 9/1980 | Hartzell | 422/245 |
| 4,249,988 | 2/1981 | Lavigna et al. | 156/617 SP |
| 4,315,832 | 2/1982 | Pastor et al. | 156/DIG. 63 |
| 4,378,269 | 3/1983 | Matsushita et al. | 156/617 SP |

Primary Examiner—David L. Lacey
Attorney, Agent, or Firm—Michael H. Wallach; Robert F. Rotella

[57] ABSTRACT

A method for reducing the radial temperature gradient of a radiant energy emitting heated body is described. The method comprises insulating such heated body with a refractory insulating material containing an efficient absorber of the radiant energy emitted by said heated body. Specifically, materials containing trivalent dysprosium are disclosed as suitable thermal insulation for use where the heated body is at a temperature in the 1800° C.–2500° C. range. Also described is a crystal growth chamber for pulling unicrystalline compositions from a melt utilizing the Czochralski technique. The chamber is characterized by the placement of a refractory insulating material containing an efficient absorber of near infrared radiation around a crucible which contains the melt. Dysprosium is specifically disclosed as an efficient absorber of the near infrared radiation which is emitted by melt and crucible at the elevated temperatures employed for boule formation utilizing the Czochralski technique.

20 Claims, 3 Drawing Figures

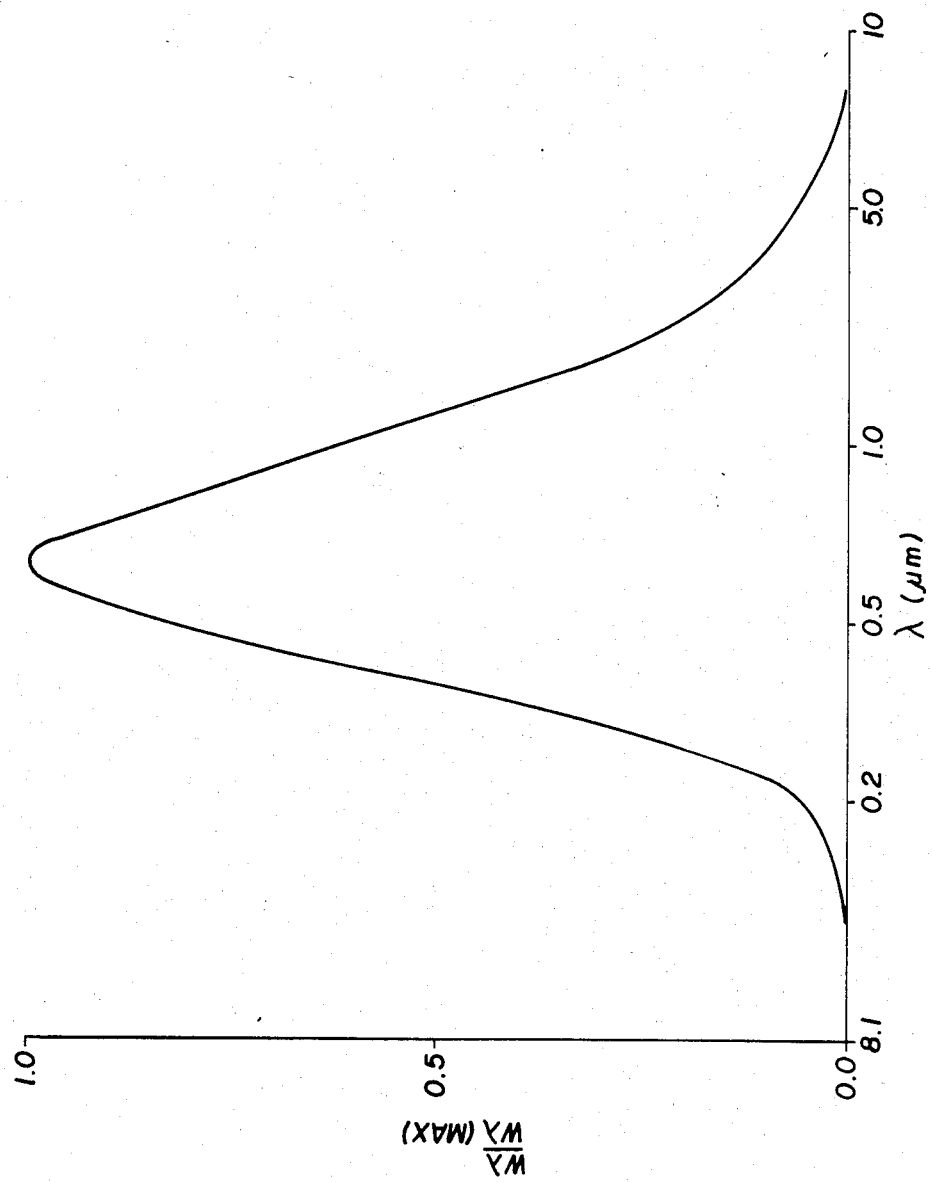
FIG. 3 EMISSION FROM A BLACKBODY AT 2300K

METHOD FOR DECREASING RADIAL TEMPERATURE GRADIENTS OF CRYSTAL GROWTH MELTS UTILIZING RADIANT ENERGY ABSORPTIVE MATERIALS AND CRYSTAL GROWTH CHAMBERS COMPRISING SUCH MATERIALS

THE BACKGROUND OF THE INVENTION

1. Field of the Invention

The present invention relates to the art of monocrystalline body formation utilizing melts, e.g. the well-known Czochralski, Bridgeman or Kyropoulos techniques. In the Czochralski technique the monocrystalline body is formed by pulling a crystal from a melt contained within a crucible. Insulating material, specifically zirconia, is generally placed around the crucible.

The present invention pertains to a new insulating material which is an efficient absorber of near infrared radiation emitted by the melt at the elevated temperatures of boule formation. Dysprosium-containing compounds and specifically dysprosium oxide alone or combined with other refractories such as zirconium, hafnium and thorium oxides is disclosed.

2. Description of the Prior Art

The use of insulation in crystal growth chambers/furnaces for Czochralski technique monocrystalline formation is well known and zironia has been used for this purpose. See for example, U.S. Pat. No. 4,199,396.

The presence of temperature gradients within melts utilized in crystal formation also has long been recognized as detrimental to optimal crystal formation. Various methods of reducing such temperature gradients have been developed. See for example, U.S. Pat. Nos. 2,956,863; 3,240,568 and 4,032,390.

In accordance with the present invention, it has been discovered that the radial temperature gradients of crystal-forming melts within Czochralski crystal growth apparatuses, that is, single crystal growth furnaces, can be reduced by utilizing the insulating material of the invention with attendant improvement in crystal quality. It has also been discovered that the power of the RF coil used to form and maintain the melt is reduced where the insulating matter selected is an efficient absorber of the near infrared radiant energy emitted by the crucible and melt at the temperature levels of crystal pulling.

BRIEF SUMMARY OF THE INVENTION

In its broadest aspect, the invention comprises a method for reducing the temperature gradients in an heated body emitting radiant energy. The method of the invention comprises insulating said body by placing thereabout a refractory insulating material comprising an efficient absorber of the radiant energy emitted by said heated body. The method of the invention is especially useful for crystal growth systems. Such systems are particularly sensitive to temperature gradients within the melts. Melt formulations, which may include fluxes dependent on the specific crystal growth system involved, are formed and maintained at elevated temperatures. Energy loss in the form of radiant energy emission is substantial in such crystal growth systems.

A more specific embodiment of the invention relates to an insulated crystal growth chamber for pulling unicrystalline compositions from a melt utilizing the Czochralski technique, wherein the insulating material comprises an efficient absorber of near infrared radiation emitted by the melt and crucible at the temperatures of boule formation.

Dysprosium ion, specifically trivalent dysprosium is the preferred material and suitably the dysprosium is present in the form of dysprosium oxide. The insulating material may also comprise both dysprosium oxide and other refractories such as zirconium oxide, hafnium oxide and thorium oxide. Also where suitable other refractories such as uranium oxide, a radioactive material, may be used. In such mixtures the mole ratio of dysprosium oxide to refractory oxide is suitably greater than 1:5. Most preferably the weight ratio of dysprosium oxide to refractory oxide is at least about 1:1.

Yet another embodiment of the invention pertains to a method of crystal growth in accordance with the Czochralski technique wherein a unicrystalline boule is pulled from a melt formed in a crucible having insulation around the sides thereof which absorbs a substantial portion of the near infrared radiation emitted radially outward from the melt into the insulation. Where the temperature at which the melt is maintained is within the range of about 1600° C. to about 2500° C., dysprosium may be used as a component of the insulation to absorb radiation emitted radially outward from the melt. Dysprosium is a most suitable insulator where the melt temperature is within the range of about 2200° K. to about 2400° K and the insulation may comprise both dysprosium oxide and zirconium oxide, such mixture suitably being one wherein the mole ratio of dysprosium oxide to zirconium oxide is at least about 1:5.

BRIEF DESCRIPTION OF THE DRAWING

FIG. 3 is a graphical representation of a Black Body Curve for radiation emitted at a temperature of 2300° K.

DETAILED DESCRIPTION OF THE INVENTION

Figure 1:
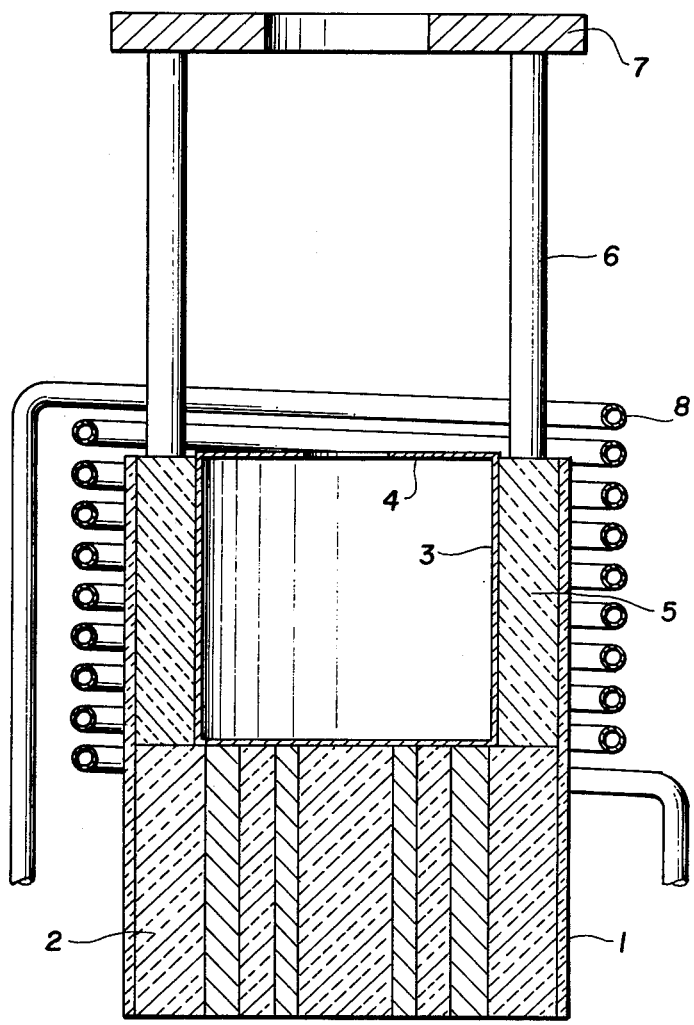
FIG. 1 is a longitudinal section of a Czochralski growth chamber with bell jar cover and base plate not shown.

The insulation of the invention is a material which is an efficient absorber of radiant energy of the frequency emitted at the temperature of crystal pulling. Trivalent dysprosium meets this requirement and has been found to be a most effective insulator in the form of the oxide, suitably in combination with zirconia in amounts of about 20% or higher by weight of dysprosium oxide.

As defined herein, an efficient absorber of radiant energy emitted at the temperature of crystal pulling is a material which absorbs a substantial amount of the near infrared radiant energy emissions (black body radiation) or stated in the alternative a material which has a low percentage of transmittance of radiant energy near the infrared wave lengths being emitted at the temperatures of boule formation.

The elevated temperature range for the formation of single crystals of high melting oxides within which the process of the invention is particularly useful, falls within the range of from about 1600° C. to 2500° C.

For purposes of ascertaining absorbance, wavelengths of the radiation emitted are assumed to correspond to the black-body curve at the operative temperature—in the case of crystal formation using the Czochralski technique, the temperature of boule formation. Within the elevated temperature range of higher melting oxide crystal formation e.g. 2300° K., the near-infrared wavelengths falling in the range of from about 0.8 μm to about 10 μm represent the predominant source of radiant energy emissions from the system (see FIG. 3 for the black-body curve at 2300° K.) The material is generally selected to have a % transmittance for 1 mm thickness of about 25% or less, preferably 10% or less, with 0% being the optimum. In the case of crystal formation the material selected should not interfere with the radio frequency energy transmitted from the heating coil, and should also be stable at the temperatures at which crystal formation is effected.

As will readily be appreciated, the specific physical form of the insulating material which is selected may vary depending on the preference of the user so long as the insulation is stable at the elevated temperatures of crystal formation and possesses the property of efficiently absorbing radiation emitted by the crucible and/or melt at the involved temperatures.

The insulating material may be used in any form desired. For example, dysprosium oxide, which has been found to be a very effective absorber of radiant energy emitted by the melt in Nd:YAG crystal growth furnaces at boule forming conditions, can be used in the form of powder or particles sintered together to produce a preselected shape adapted to retain a crucible within which melt is formed.

Moreover, insulating materials of the invention, such as the aforementioned dysprosium oxide can be combined with other insulating materials. In this regard, dysprosium oxide can be combined with zirconia, the latter zirconia being the insulating material of choice in the prior art for single crystal growth devices. Zirconium oxide is a material which is almost transparent to the radiation emitted from furnaces operating at the elevated temperatures of crystal formation which are in the near 2300° K. range; however, the presence of dysprosium oxide either in physical admixture with zirconium oxide or combined with zirconium oxide in crystalline form dramatically lowers insulating material transmittance of radiant energy radiating outward from the melt and crucible.

A typical arrangement for achieving and maintaining the melt at constant temperature for a crystal pulling is illustrated in FIG. 1.

Within a quartz tube envelope (1), is located a bed of granular $ZrO_2$ insulation (2). Supported on said bed is an iridium crucible (3), covered with iridium crucible cover (4). An insulating material comprised by $Dy_2O_3$ and $ZrO_2$ (5) is placed between the side of the crucible and the quartz tube. An alumina tube insulator (6) is supported on the dysprosium-containing insulation and in turn covered by an alumina tube insulator cover (7).

The melt is heated by RF coil (8). A seed rod (not shown) is inserted through the alumina tube insulator cover and iridium crucible cover into the crucible.

It is, of course, possible to achieve the advantages of this invention by partially filling the space intermediate crucible side and quartz tube envelope with dysprosium containing insulating material; however, for best results such material should preferably extend to a locus substantially even with the top of the melt.

Moreover, the vertical temperature gradients can also be diminished by utilizing growth furnace appurtenances comprising dysprosium in absorbent form or an equivalent and/or otherwise suitable efficient near infrared wavelength radiation absorber.

EXAMPLE

Following the skull process oulined in U.S. Pat. No. 4,224,100, the teaching of which is incorporated herein by reference thereto, a charge of 14920 g of powdered $Dy_2O_3$, 7380 g of powdered $ZrO_2$ and a mass of about 250–400 g of zirconium metal for initial coupling and heating were introduced into a porous cylindrical container having an interior wall comprised of a porous zirconium oxide felt, and then tamped to form a non-rigid cylindrical mass within the container.

After forming a vent in the non-rigid mass for venting the interior thereof, the charge was heated by movement through an RF field and a melt was formed within the porous cylindrical container.

After formation of the melt, RF heating was discontinued and the melt was allowed to cool by heat loss through the periphery thereof. Upon cooling, crystals comprised of about 66.91 wt. % $Dy_2O_3$ and 33.09 wt. % $ZrO_2$ were formed.

Figure 2:
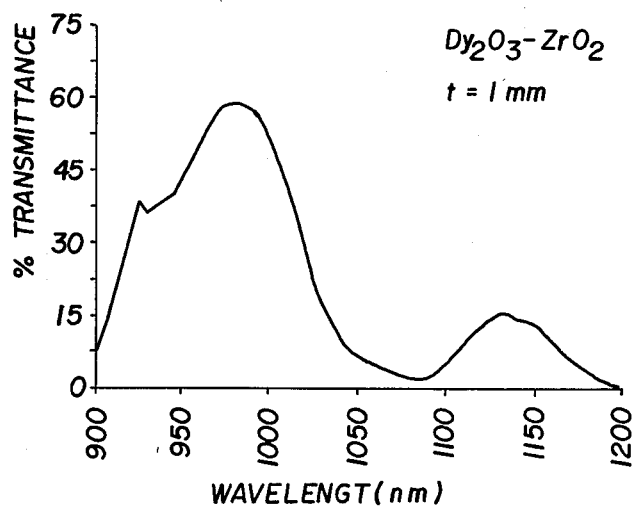
FIG. 2 is a graphical representation of the % transmittance of a 1 mm thickness of a typical dysprosium and zirconium oxide single crystal compound of the invention.

In FIG. 2, the % transmittance of a 1 mm thickness of the foregoing material is depicted for near-infrared wavelengths; that is, wavelengths in the range of from about 0.8 μm to about 10 μm.

The crystals were recovered by removing the solidified melt from the enclosure and broken by thermal fracturing and mechanical crushing to form grains of a size falling substantially within the range of from 1 to 5 mm.

Utilizing a 4.5×4.5 inch cylindrical iridium crucible and an identical geometry of all other furnace parts, three runs were made to measure the radial temperature gradients of the above-described grog comprised of about 40 mole % $Dy_2O_3$ and 60 mole % $ZrO_2$ for the purpose of comparing same with the prior art $ZrO_2$ insulating grog.

Thermal gradient measurement was accomplished by scanning an optical pyrometer from the center of the melt to a position one inch from the center along the radius of the crucible. Data was collected in the same chamber/station, utilizing the same geometry of insulating parts. The measurements were taken when all Nd:YAG in the crucible just melted. The temperature gradient data are listed in Table I.

TABLE I

| Measurements of Radial Thermal Gradients | | | |
|---|---|---|---|
| Position (Inches from Center of Melt) | Run A Regular | Run B Dy | Run C Dy |
| 0 | 1950 | 1950 | 1950 |
| 0.1 | 1965 | 1960 | 1960 |
| 0.2 | 1980 | 1970 | 1970 |
| 0.3 | 1985 | 1985 | 1980 |
| 0.4 | 1990 | 1990 | 1990 |
| 0.5 | 2000 | 2000 | 1990 |
| 0.6 | 2010 | 2005 | 1995 |
| 0.7 | 2015 | 2010 | 2000 |
| 0.8 | 2020 | 2015 | 2005 |
| 0.9 | 2030 | 2020 | 2010 |
| 1.0 | 2035 | 2030 | 2020 |

Run A denotes the observed radial thermal gradients where the $ZrO_2$ of the prior art was utilized. Runs B and C each represent runs utilizing the above-described dysprosiumcontaining zirconia surrounding the upper 2 inches of an 4½ inch high crucible. Where the material surrounds the crucible for its entire height additional improvement has been observed.

After completion of crystal growth the crystals from Runs A, B and C were examined. A marked increase in crystal yield was observed in runs B and C, which increase was attributable to the better quality of boule obtained where the dysprosium oxide-containing insulating material was utilized for insulation.

It will be obvious that modification to the invention may be made and it is intended to cover such modifications and changes as would occur to one skilled in the art, as the followclaims permit and consistent with the prior art.

We claim:

1. In a method of crystal growth wherein crystal is formed from a melt in a crucible having insulation aroound the sides thereof, with said melt emitting near infrared radiation, the improvement which comprises absorbing in said insulation a substantial portion of the near infrared radiation emitted radially outwardly from the melt.

2. The method of claim 1 wherein the crystal growth is effected utilizing the Czochralski technique wherein a unicrystalline boule is pulled from the melt.

3. The method of claims 1 or 2 wherein the temperature of the melt is maintained within the range of about 1600° C. to about 2500° C. and trivalent dysprosium is used as a component of the insulation to absorb radiation emitted radially outward from the melt.

4. The method of claim 2 wherein the temperature of the melt is within the range of about 2200° K. to about 2400° K.

5. The method of claim 4 wherein the boule being grown is Nd:YAG.

6. The method of claim 2 wherein the insulation comprises zirconium oxide and dysprosium oxide wherein the mole ratio of dysprosium oxide to zirconium oxide is at least 1:5.

7. In a crystal growth chamber wherein crystalline compositions are formed from a melt, said growth chamber having a crucible with sidewalls for containing said melt, the improvement which comprises an insulating material comprising trivalent dysprosium surrounding at least a portion of the sidewalls of said crucible, said trivalent dysprosium being a refractory comprising an efficient absorber of near infrared radiation emitted by the melt at its formation temperature.

8. The crystal growth chamber of claim 7 wherein the dysprosium is present in the form of dysprosium oxide.

9. In a crystal growth chamber constructed for pulling unicrystalline compositions from a melt utilizing the Czochralski technique, said chamber including a crucible having sidewalls for holding said melt, the improvement which comprises an insulating material comprising trivalent dysprosium which surrounds at least a portion of the sidewalls of said crucible, said insulating material being an efficient absorber of near infrared radiation emitted by the melt and crucible at the temperature of boule formation.

10. The crystal growth chamber of claim 9 wherein the dyprosium is present in the form of dysprosium oxide 11. In a crystal growth chamber wherein crystalline compositions are formed from a melt, said growth chamber having a crucible with sidewalls for containing said melt, the improvement which comprises an insulating material comprising dysprosium oxide and another refractory oxide surrounding at least a portion of the sidewalls of said crucible, said dysprosium oxide and other refractory oxide being a refractory comprising an efficient absorber of near infrared radiation emitted by the melt at its formation temperature.

12. The crystal growth chamber of claim 11 wherein the other refractory oxide is selected from the group consisting of zirconium oxide, hafnium oxide, thorium oxide and mixtures thereof.

13. The crystal growth chamber of claim 12 wherein the other refractory oxide is zirconium oxide.

14. The crystal growth chamber of claim 11, 12 or 13, wherein the mole ratio of dysprosium oxide to the other refractory oxide is greater than 1:5.

15. The crystal growth chamber of claim 6 wherein the weight ratio of dysprosium oxide to zirconium oxide is at least 1:1.

16. In a crystal growth chamber constructed for pulling unicrystalline conpositions from a melt utilizing the Czochralski technique, said chamber including a crucible having sidewalls for holding said melt, the improvement which comprises an insulating material comprising dysprosium oxide and another refractory oxide which surrounds at least a portion of the sidewalls of said crucible, said insulating material being an efficient absorber of near infrared radiation emitted by the melt and crucible at the temperatures of boule formation.

17. The crystal growth chamber of claim 16 wherein the other refractory oxide is selected from the group consisting of zirconium oxide, hafnium oxide, thorium oxide and mixtures thereof.

18. The crystal growth chamber of claim 17 wherein the other refractory oxide is zirconium oxide.

19. The crystal growth chamber of claim 16, 17 or 18, wherein the mole ratio of dysprosium oxide to other refractory oxide is greater than 1:5.

20. The crystal growth chamber of claim 18 wherein the weight ratio of dysprosium oxide to zirconium oxide is at least 1:1.

* * * * *

UNITED STATES PATENT AND TRADEMARK OFFICE
CERTIFICATE OF CORRECTION

PATENT NO. : 4,478,676                  Page 1 of 2
DATED : October 23, 1984
INVENTOR(S) : Roger F. Belt; Robert Uhrin It is certified that error appears in the above—identified patent and that said Letters Patent is hereby corrected as shown below:

Col. 1, line 7 – After the Title of the Invention, add the following paragraph:
--The Government has rights in this invention pursuant to Contract No. DAAB-07-77-C-0375 awarded by the Department of the Army.-- line 28 – Delete "zironia" and substitute therefor --zirconia--.

line 43 – Delete "of" and substitute therefor --to--.

Col. 3, line 52 – Delete "by" and substitute therefor --of--.

Col. 4, line 67 – Delete "dysprosiumcontaining" and substitute therefor --dysprosium-containing--.

Col. 5, line 12 – Delete "followclaims" and substitute therefor --following claims--.

UNITED STATES PATENT AND TRADEMARK OFFICE
CERTIFICATE OF CORRECTION

PATENT NO. : 4,478,676

DATED : October 23, 1984

INVENTOR(S) : Roger F. Belt; Robert Uhrin

It is certified that error appears in the above—identified patent and that said Letters Patent is hereby corrected as shown below:

Col. 5, line 17 — Delete "aroound" and substitute therefor --around--.

Col. 6, lines 4&5— Delete "temperature" and substitute therefor --temperatures--.

line 28 — Delete the number "6" and substitute therefor the number --13--.

line 32 — Delete "conpositions" and substitute therefor --compositions--.

Signed and Sealed this

Eleventh Day of June 1985

[SEAL]

Attest:

DONALD J. QUIGG

Attesting Officer  Acting Commissioner of Patents and Trademarks